United States Patent
Anderson et al.

(10) Patent No.: US 7,635,546 B2
(45) Date of Patent: Dec. 22, 2009

(54) PHASE SHIFTING PHOTOMASK AND A METHOD OF FABRICATING THEREOF

(75) Inventors: Scott Alan Anderson, Livermore, CA (US); Xiaoyi Chen, Foster City, CA (US); Michael N. Grimbergen, Redwood City, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/838,418

(22) Filed: Aug. 14, 2007

(65) Prior Publication Data

US 2008/0070130 A1   Mar. 20, 2008

Related U.S. Application Data

(60) Provisional application No. 60/825,900, filed on Sep. 15, 2006.

(51) Int. Cl.
  *G03F 1/00*   (2006.01)
(52) U.S. Cl. .......................................... 430/5
(58) Field of Classification Search .................. 430/5; 438/684, 775
  See application file for complete search history.

(56) References Cited

U.S. PATENT DOCUMENTS

| | | | |
|---|---|---|---|
| 6,569,595 B1 * | 5/2003 | Sato et al. ................ | 430/270.1 |
| 6,942,813 B2 * | 9/2005 | Ying et al. .................... | 216/22 |
| 7,115,523 B2 * | 10/2006 | Stoehr et al. ................. | 438/721 |
| 2003/0180631 A1 * | 9/2003 | Shiota et al. .................... | 430/5 |
| 2004/0209476 A1 * | 10/2004 | Ying et al. ................... | 438/706 |
| 2005/0238963 A1 * | 10/2005 | Ishibashi et al. ............... | 430/5 |
| 2006/0154151 A1 | 7/2006 | Anderson et al. | |
| 2006/0166106 A1 | 7/2006 | Chandrachood et al. | |
| 2006/0166107 A1 * | 7/2006 | Chen et al. ..................... | 430/5 |
| 2006/0166108 A1 | 7/2006 | Chandrachood et al. | |
| 2007/0072435 A1 | 3/2007 | Kumar | |
| 2007/0184354 A1 | 8/2007 | Chandrachood et al. | |

FOREIGN PATENT DOCUMENTS

| | | |
|---|---|---|
| KR | 2004-0054805 | 6/2004 |
| KR | 2005-0026337 | 3/2005 |

OTHER PUBLICATIONS

Notice to File a Response from the Korean Intellectual Property Office dated Dec. 13, 2008. A Concise Statement of Relevance is provided.

Notice of Final Rejection from the Korean Intellectual Property Office dated May 26, 2009, for corresponding Korean Patent Application No. 10-2007-0084282. A Concise Statement of Relevance is provided.

* cited by examiner

*Primary Examiner*—Stephen Rosasco
*Assistant Examiner*—Rashid Alam
(74) *Attorney, Agent, or Firm*—Patterson & Sheridan, LLP

(57) ABSTRACT

A phase shifting photomask comprising a patterned film stack formed on a transparent substrate and a method of fabricating the photomask are disclosed. In one embodiment, the film stack includes a first layer having a pre-determined value of transparency to light of an illumination source of a lithographic system and a second layer that is substantially transparent to the light and facilitates in the light a pre-determined phase shift.

10 Claims, 6 Drawing Sheets

PHASE SHIFTING PHOTOMASK AND A METHOD OF FABRICATING THEREOF

CROSS-REFERENCE TO OTHER APPLICATIONS

This application claims the benefit of U.S. Provisional Application No. 60/825,900 filed Sep. 15, 2006, which is herein incorporated by reference.

BACKGROUND

1. Field of the Invention

Embodiments of the present invention generally relate to photomasks used in the semiconductor industry to manufacture integrated circuits and, more specifically, to phase shifting photomasks and methods of their fabrication.

2. Description of the Related Art

In the manufacture of integrated circuits (ICs), or chips, patterns of different layers of the chip are created using reusable photomasks, or reticles. Typically, a set of 15-30 or more reticles is used to construct a chip, and the reticles can be used repeatedly. Herein, the terms "photomask" and "reticle" are used interchangeably. Each photomask lithographically transfers, or prints, the design of a respective chip layer in a photoresist layer disposed on a semiconductor substrate. The precision of the photomask is very important as defects in photomasks may be transferred to the chip, potentially adversely affecting circuit performance.

A conventional photomask generally comprises a light-transparent glass or quartz substrate having a patterned layer of chromium that forms opaque regions of the image to be transferred in the photoresist layer. Photomasks suitable for printing advanced sub-150 nm features utilize interferometric properties of light used by an illumination source of the respective lithographic system and are commonly known in the art as phase shifting photomasks. A phase shifting photomask comprises patterns of regions having alternating optical lengths. Typically, in adjacent regions, a difference in the optical lengths is about a half of a wavelength of the light utilized to expose the photoresist. Such photomasks facilitate transfer of the images with resolution that exceeds optical limitations of the conventional photomasks.

However, despite the considerable effort in the art devoted to development of the phase shifting photomasks, further improvements in the photomasks and methods of fabricating thereof would be desirable.

SUMMARY

A phase shifting photomask and a method of fabricating the same are provided. In one embodiment, a phase shifting photomask includes a patterned film stack formed on a transparent substrate. The film stack includes a first layer disposed in the substrate and having a pre-determined value of transparency to the light, and a second layer disposed on the first layers, wherein the first and the second layers are selected to cause a 180 degrees phase shift in the light passing through the first and the second layers relative to light passing through the opening substantially transparent to the light.

In another embodiment, a phase shifting photomask includes a substrate, and a film stack formed on the substrate and having at least one opening formed therein and exposing a portion of the substrate, wherein the film stack includes at least a silicon dioxide layer disposed on a tantalum layer, wherein the film stack and substrate having characteristics that result in a 180 degrees phase shift of light passing through the film stack relative to the substrate.

In yet another embodiment, a method for fabricating a phase shifting photomask includes providing a substrate substantially transparent to light produced by an illumination source of a lithographic system, the substrate comprising a film stack, wherein the film stack and substrate having characteristics that result in a 180 degrees phase shift of light passing through the film stack relative to the substrate, the film stack further comprising a sacrificial upper layer, a first layer having a pre-determined value of transparency to the light, and a second layer substantially transparent to the light, forming a patterned etch mask on the sacrificial upper layer, etching exposed portions of the sacrificial upper layer, etching exposed portions of the second layer, etching exposed portions of the first layer using the substrate as an etch stop layer, removing the patterned etch mask and removing the sacrificial upper layer In still another embodiment, a method for fabricating a phase shifting photomask may include providing a quartz substrate having a tantalum (Ta) layer, a silicon dioxide ($SiO_2$) layer, a chromium (Cr) containing layer, and a patterned photoresist etch mask on the Cr containing layer, etching portions of the Cr containing layer exposed through the etch mask, etching portions of the $SiO_2$ layer exposed through the etched Cr containing layer, etching portions of the Ta layer exposed through the etched $SiO_2$ layer using the substrate as an etch stop layer, removing the patterned etch mask, and removing the Cr containing layer.

The Summary is neither intended nor should it be construed as being representative of the full extent and scope of the present invention, which these and additional aspects will become more readily apparent from the detailed description, particularly when taken together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
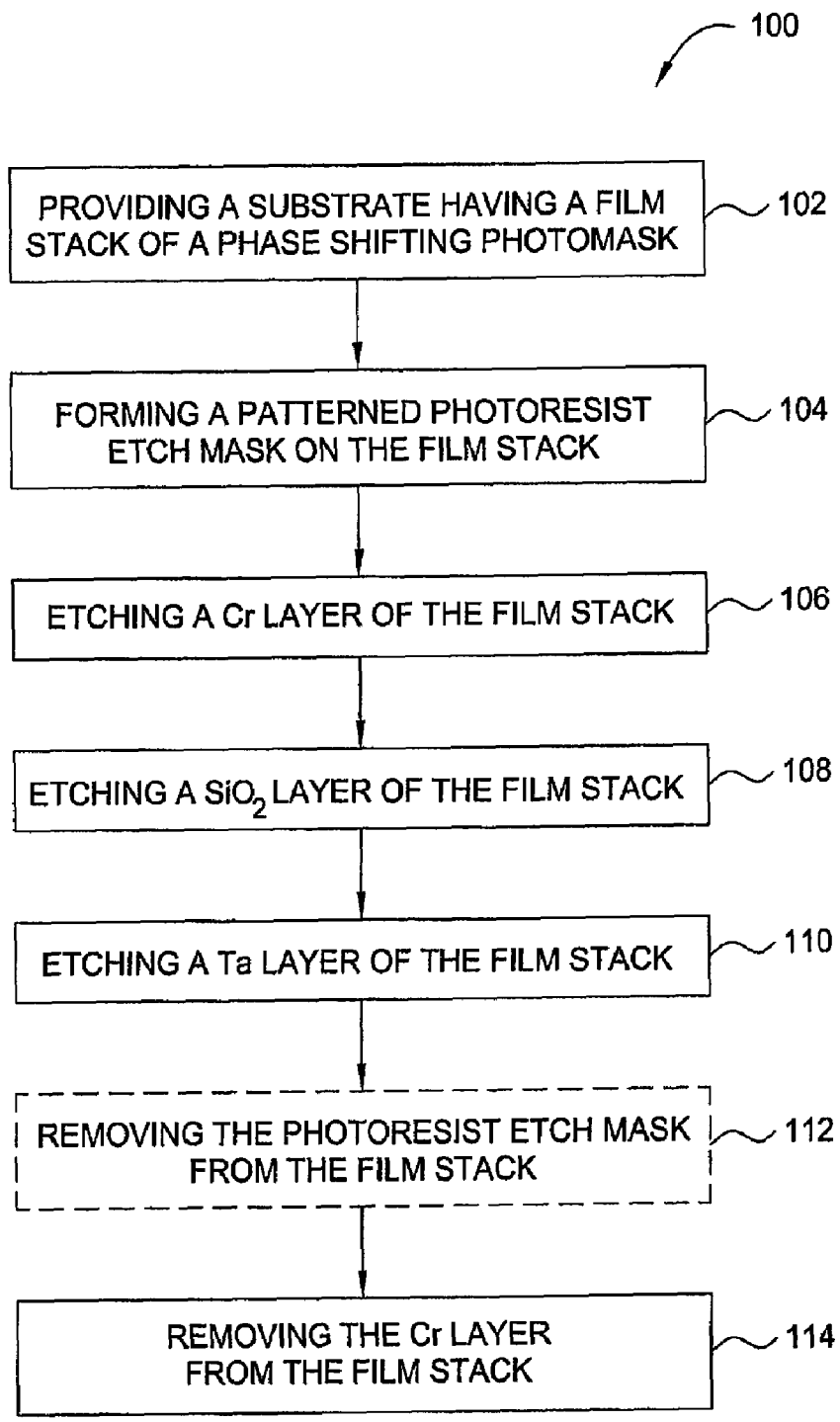
FIG. 1 is a flow diagram illustrating a method for fabricating a phase shifting photomask in accordance with one embodiment of the present invention.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale. It is contemplated that features or steps of one embodiment may be beneficially incorporated in other embodiments without further recitation.

DETAILED DESCRIPTION

FIG. 1 is a flow diagram illustrating a method 100 for fabricating a phase shifting photomask (PSM) in accordance with one embodiment of the present invention. In some embodiments, the method steps are performed using separate processing reactors. In alternate embodiments, at least two of the method steps may be performed in the same processing reactor (i.e., in-situ) or in different reactors.

In one exemplary embodiment, etch processes of the method 100 (discussed in reference to blocks 106, 108, and 110) are performed using Tetra I or Tetra II Photomask plasma reactors or a Decoupled Plasma Source (DPS®) II reactor, all of which are available from Applied Materials, Inc. of Santa Clara, Calif. Salient features of these reactors are discussed below in reference to FIG. 3. The DPS® II reactor is typically used as a processing module of the Centura® integrated processing system, also available from Applied Materials, Inc. One skilled in the art will readily appreciate that such etch processes may also be performed using etch reactors available from other equipment manufacturers.

FIGS. 2A-2H are schematic, cross-sectional views of a portion of a substrate comprising a film stack of a PSM being fabricated during successive blocks of the method 100 of FIG. 1. The cross-sectional views in FIGS. 2A-2H illustrate individual processing steps of the method 100. To best understand the invention, the reader should simultaneously refer to FIG. 1 and FIGS. 2A-2H. Sub-processes and lithographic routines (e.g., exposure and development of photoresist, wafer cleaning procedures, and the like) are well known to those skilled in the art and, as such, are not shown in FIG. 1 and FIGS. 2A-2H.

Figure 2A:
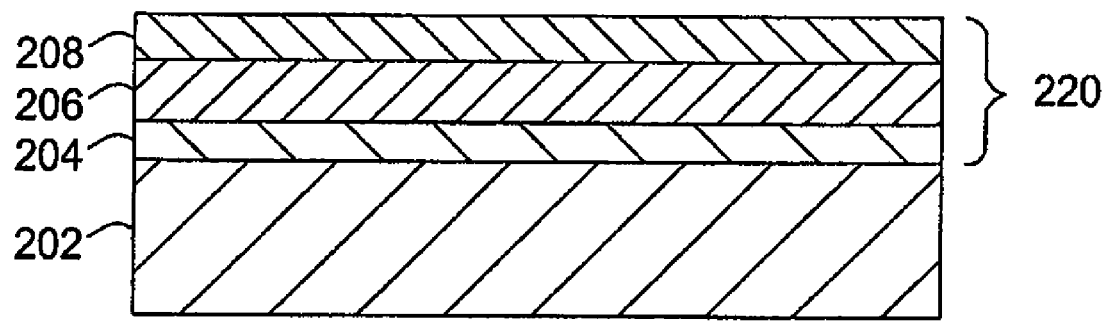
FIGS. 2A-2H are schematic, cross-sectional views of a portion of a substrate comprising a film stack of a phase shifting photomask during successive steps of the method of FIG. 1.
Figure 2B:
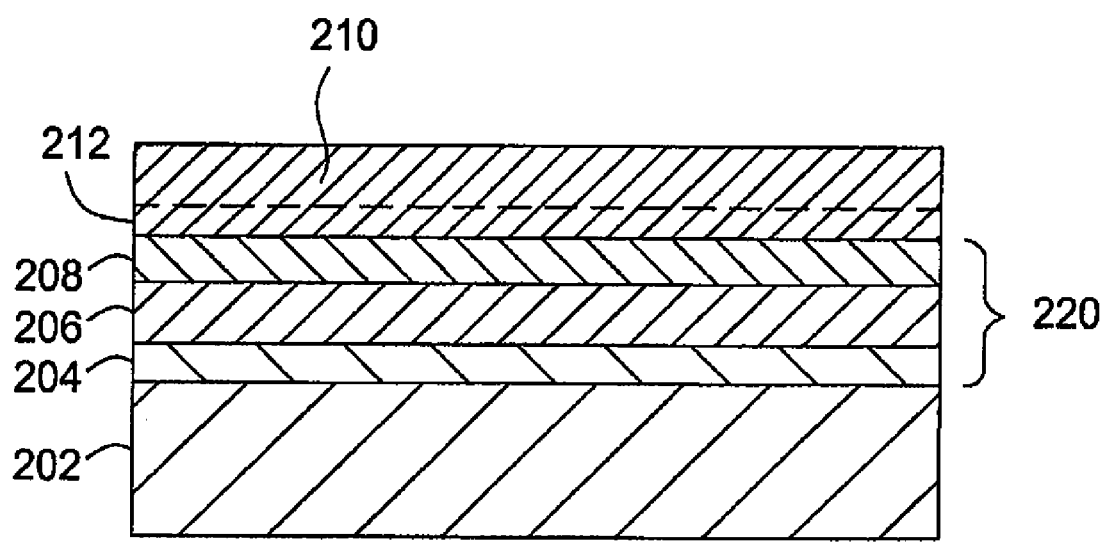

The method 100 begins at block 102 when a film stack 220 suitable for fabricating a PSM is formed on a substrate 202 (FIG. 2A). In one particular embodiment, the substrate 202 is adapted for use in a lithographic system. The substrate 202 may be formed from quartz or other material (for example, glass) that is optically transparent to the light provided by illumination sources of lithographic systems using such PSMs, for example, to the light of deep-ultraviolet excimer lasers radiating at 193 nm, 158 nm, or shorter wavelengths.

The film stack 220 generally comprises a semi-transparent layer 204, a phase-shifting layer 206, and a sacrificial protective layer 208, which are consecutively deposited on the substrate 202. In other embodiment, the layers 204 and 206 may be deposited on the substrate 202 in a different order. The sacrificial protective layer 208 is generally formed from a material that is resistant to etch processes used during the method 100 to pattern the semi-transparent layer 204 and the phase-shifting layer 206.

In the embodiment depicted in FIG. 2A, the film stack 220 includes consecutively deposited a tantalum (Ta) layer 204, a silicon dioxide ($SiO_2$, or quartz) layer 206, and a chromium (Cr) layer 208. The Ta layer has a thickness in a range of about 5 to about 50 nm. When formed to such thicknesses, the Ta layer 204 provides a pre-determined value of transparency for the light of an illumination source used in lithographic systems. The $SiO_2$ layer 206 is substantially transparent to the light of the illumination source and formed to a pre-determined thickness in a range from about 50 to about 300 nm. In the PSM being fabricated, the $SiO_2$ layer 206 (and, in some embodiments, the combined effect of the Ta and $SiO_2$ or quartz layer) facilitates a pre-determined phase shift (e.g., approximately 180 degrees phase shift) in the light used in the lithographic system when passing through the mask. The Cr layer 208 is a sacrificial protective layer having a thickness in a range from about 20 to about 200 nm. In one embodiment, thicknesses of layers 204, 206, and 208 are about 20, 150, and 60 nm, respectively.

It has been contemplated that the layers 204, 206, and 208 may be fabricated from other materials having similar optical or physical properties. Specifically, the layer 204 may be formed from a material providing controlled transparency for the light of the illumination sources and the layer 206 may be formed from a material transparent to that light, whereas a material of the layer 208 is selected based on its compatibility with processing steps of the method 100. For example, in alternate embodiments, the layers 204, 206, and 208 may be fabricated from a $MoSi_xO_yN_z$ stack. As such, a particular use of Ta, $SiO_2$, and Cr in the layers of the film stack 220 is exemplary and should not limit the scope of the present invention.

The layers of the film stack 220 can be formed using any conventional thin film deposition technique, for example, atomic layer deposition (ALD), physical vapor deposition (PVD), chemical vapor deposition (CVD), plasma enhanced CVD (PECVD), and the like. The layers may be deposited, for example, using corresponding reactors of CENTURA®, ENDURA®, and other processing systems available from Applied Materials, Inc., or processing reactors of other equipment manufacturers.

Figure 2C:
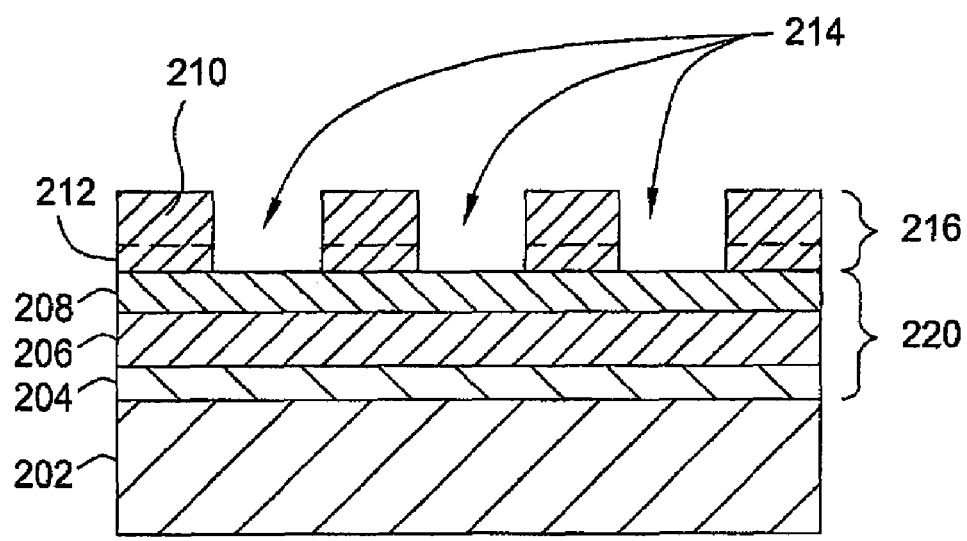

At block 104, a photoresist layer 210 is applied to the sacrificial protective layer 208 (FIG. 2B) and then, using a conventional lithographic routine, the layer 210 is patterned to form a photoresist mask 216 (FIG. 2C). Openings in the photoresist mask 216 define location and topographic dimensions of features 214 to be formed in the layers of the film stack 220 during consecutive steps of the method 100. The features 214 may have different topologies or shapes, including the shapes such as contacts, trenches, OPC features and the like.

The layer 210 may comprise an optional anti-reflective layer 212 (shown in phantom) that controls the reflection of the light used to pattern the photoresist layer 210 and reduces inaccuracies in a pattern transfer process that arise from light reflections. The layer 212 is typically formed from one or more films of materials, such as silicon nitride (SiN), polyamides, and the like.

Figure 2D:
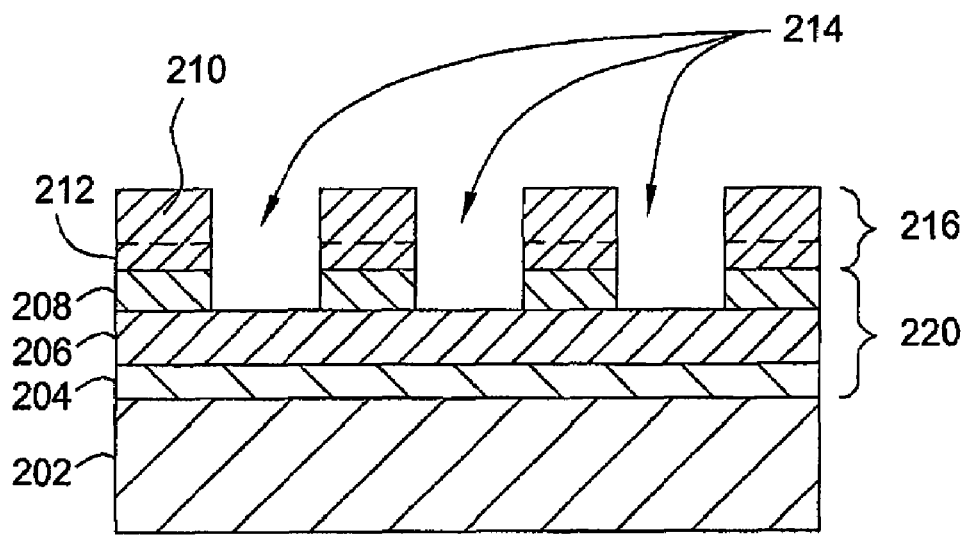

At block 106, the sacrificial protective layer 208 is etched using the photoresist mask 216 as an etch mask (FIG. 2D). Upon completion of an etch process of block 106, the features 214 are transferred from the mask 216 into the sacrificial protective layer 208.

In one embodiment, the Cr layer 208 is etched using a plasma comprising at least one chlorine-containing gas (e.g., chlorine ($Cl_2$)) or at least one fluorine-containing gas (e.g., sulfur hexafluoride ($SF_6$) or carbon tetrafluoride ($CF_4$)). Such processes for etching Cr are described in the commonly assigned U.S. Pat. No. 7,018,934 B2, issued Mar. 28, 2006, which is incorporated herein by reference in its entirety. It has been contemplated that other suitable etch processes may also be utilized for etching the Cr layer 208.

Figure 2E:
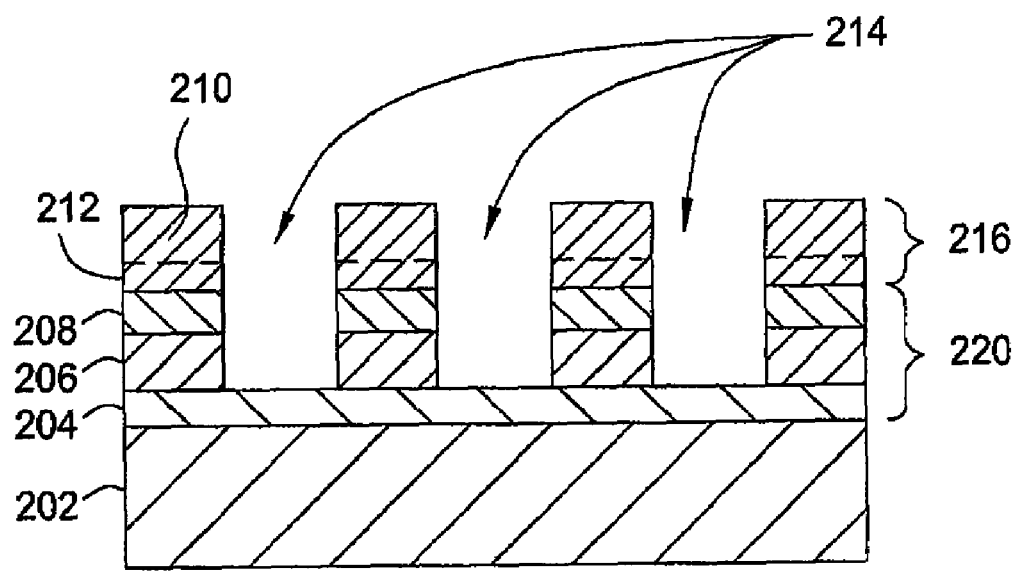

At block 108, the phase-shifting layer 206 is etched using the photoresist mask 216 and, optionally or additionally, underlying portions of the sacrificial protective layer 208 as an etch mask (FIG. 2E). In an alternate embodiment (not shown), prior to etching the phase-shifting layer 206, the photoresist mask 216 may be removed using, for example, a conventional ashing or wet etch process. During preceding block 106, the photoresist mask 216 may partially be eroded, and then the patterned sacrificial protective layer 208 is used as a hard etch mask that defines the topology of the features 214 being formed in the layer 206.

An etch process of block 108 uses the semitransparent layer 204 as an etch stop layer. To determine the endpoint of the etch process, the etch reactor may use an endpoint detection system to monitor plasma emissions at a particular wavelength, laser interferometry, control of process time, and the like. In a particular embodiment, emissions at the silicon tetrafluoride ($SiF_4$) molecular line of 3363 Angstroms may be used by the endpoint detection system. Alternatively emissions at the cyanogen (CN) molecular line of 3871-3883 Angstroms may be used by the endpoint detection system.

In one embodiment, the $SiO_2$ layer 206 is etched by providing carbon tetrafluoride ($CF_4$) at a flow rate of about 2 to about 100 sccm and trifluoromethane ($CHF_3$) at a flow rate of about 5 to about 100 sccm (i.e., a $CF_4$:$CHF_3$ flow ratio ranging from about 1:50 to about 10:1), applying plasma source power between about 100 and about 1500 W at a frequency of about 13.56 MHz, applying bias power between about 10 and about 200 W at a frequency of about 500 Hz to 10 kHz, and maintaining chamber pressure between about 0.5 and about 20 mTorr. In some embodiments, the etch process may use continuous wave or pulsed plasma source; and/or continuous wave or pulsed bias power, or be performed as a multi-step etch process. In some embodiments, some combination of the aforementioned methods may be used.

In one embodiment, $CF_4$ is provided at a flow rate of about 12.5 sccm, $CHF_3$ is provided at a flow rate of about 22.5 sccm (i.e., a $CF_4$:$CHF_3$ flow ratio of about 1:1.8), about 425 W of plasma source power is applied at a frequency of about 13.56 MHz, about 50 W of bias power, and chamber pressure is maintained at about 2 mTorr. Such etch process forms the features 214 having a sidewall angle of about 88-90 degrees. The process has etch selectivity for $SiO_2$ (layer 206) over Cr (layer 208) of at least about 15:1, as well as etch selectivity for $SiO_2$ over photoresist (mask 216) of at least about 0.5:1.

In another embodiment, block 108 may use the etch process described in the commonly assigned U.S. patent application Ser. No. 11/031,885, filed Jan. 8, 2005, which is incorporated herein by reference in its entirety.

Figure 2F:
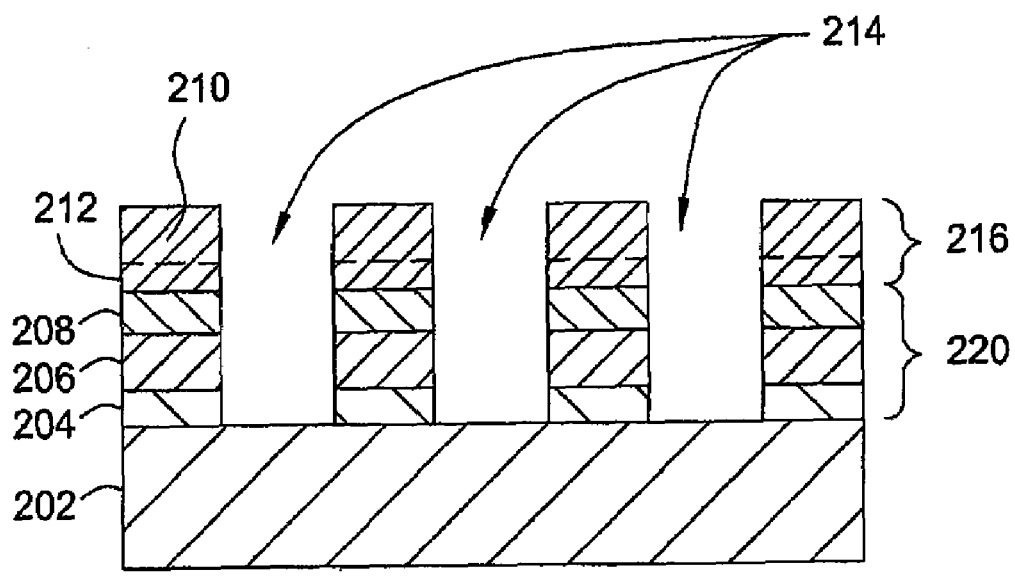

At block 110, the semi-transparent layer 204 is etched using the photoresist mask 216 and, optionally or additionally, underlying portions of the sacrificial protective layer 208 as an etch mask (FIG. 2F). An etch process of block 110 uses the substrate 202 as an etch stop layer. In a particular embodiment, emissions at the Tantalum line of 3311 Angstroms are used by the endpoint detection system.

In another embodiment (not shown), prior to etching the semi-transparent layer 204, the photoresist mask 216 may be removed using, for example, a conventional ashing or wet etch process. During preceding steps 106 and 108, the photoresist mask 216 may partially be eroded, and then the patterned sacrificial protective layer 208 is used as a hard etch mask that defines the topology of the features 214 being formed in the layer 204.

In one embodiment, the Ta layer 204 is etched by providing chlorine ($Cl_2$) at a flow rate of about 10 to about 200 sccm and Argon (Ar) at a flow rate of about 10 to about 200 sccm (i.e., a $Cl_2$:Ar flow ratio ranging from about 1:20 to about 20:1), applying plasma source power between about 75 and about 1500 W at a frequency of about 13.56 MHz, applying bias power between about 5 and about 100 W, and maintaining chamber pressure between about 1 and about 20 mTorr. In some embodiments, the etch process may use continuous wave or pulsed plasma source; and/or continuous wave or pulsed bias power, or be performed as a multi-step etch process. In some embodiments, some combination of the aforementioned methods may be used.

In one embodiment, $Cl_2$ is provided at a flow rate of 40 sccm, Ar is provided at a flow rate of about 40 sccm (i.e., a $Cl_2$:Ar flow ratio of about 1:1), about 300 W of plasma source power is applied at a frequency of about 13.56 MHz, about 25 W of bias power, and chamber pressure is maintained at about 2 mTorr. The process has etch selectivity for Ta (layer 204) over quartz (substrate 202, layer 206) of at least about 10:1, as well as etch selectivity for Ta over photoresist (mask 216) of about 1:1.

Figure 2G:
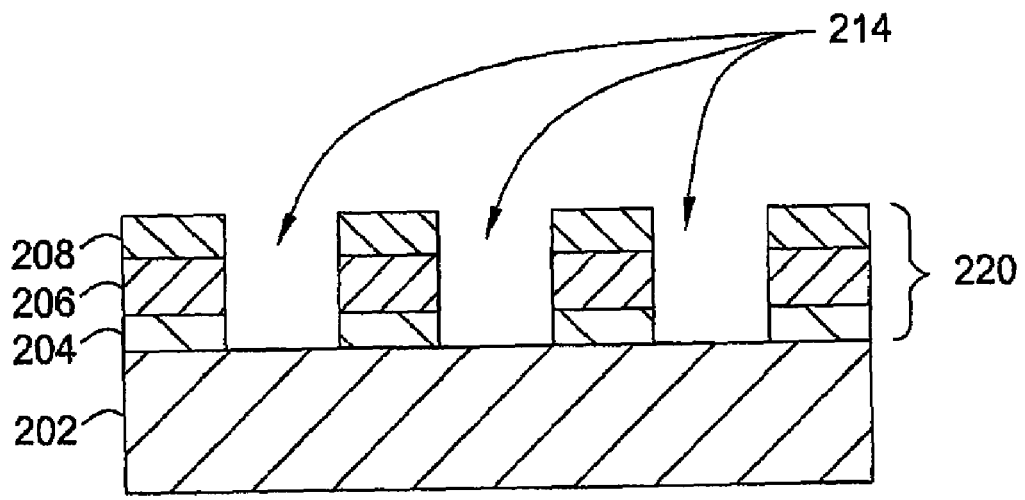

At block 112, the photoresist mask 216 is removed from the film stack 220 using, for example, an ashing process or a wet etch process (FIG. 2G). As discussed above in reference to blocks 108 and 110, in some embodiments the photoresist mask 216 may be removed during one of these steps. As such, block 112 may not be required at this point in the fabrication sequence.

Figure 2H:
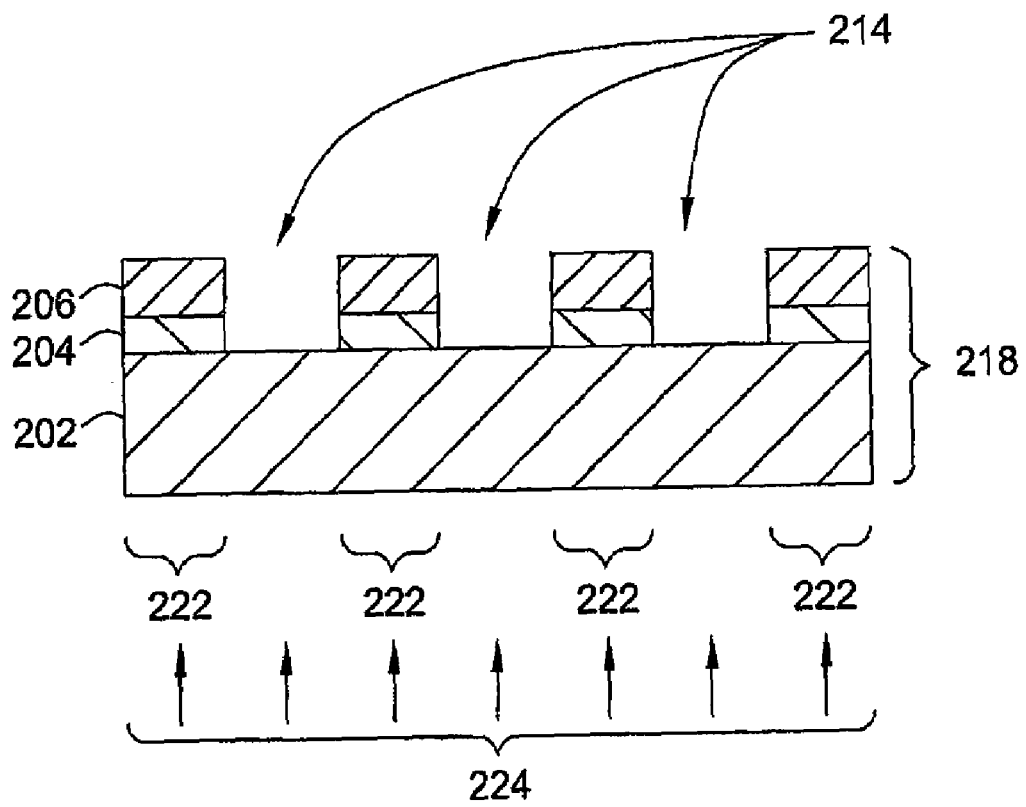

At block 114, the sacrificial protective layer 208 is removed from the phase-shifting layer 206 (FIG. 2H). In one embodiment, block 114 performs a wet etch process that uses at least one perchloric-based solvent (e.g., Cyantek CR-7s, CRE-473, TFD/1020 and the like), available from Transene Company, Inc., of Danvers, Mass., among other suppliers. The process achieves etch selectivity for Cr (layer 208) over quartz (substrate 202, layer 206) of at least about 20:1, as well as etch selectivity for Cr over Ta (layer 204) of about 10:1. Alternatively, the sacrificial protective layer 208 may be removed using etch processes discussed above with reference to block 106.

After the sacrificial protective layer 208 is removed, the substrate 202, together with the remaining portions of the film stack 220, forms a PSM 218. In operation, rays of the light 224 from an illumination source of a lithographic system propagating through regions 222 of the PSM 218 experience a pre-determined phase shift relative to the rays propagating through the substrate 202 and features 214. The PSMs 218 may be used to fabricate integrated circuits which elements have critical dimensions of at least about 45 nm or smaller. Upon completion of block 114, the method 100 ends.

Figure 3:
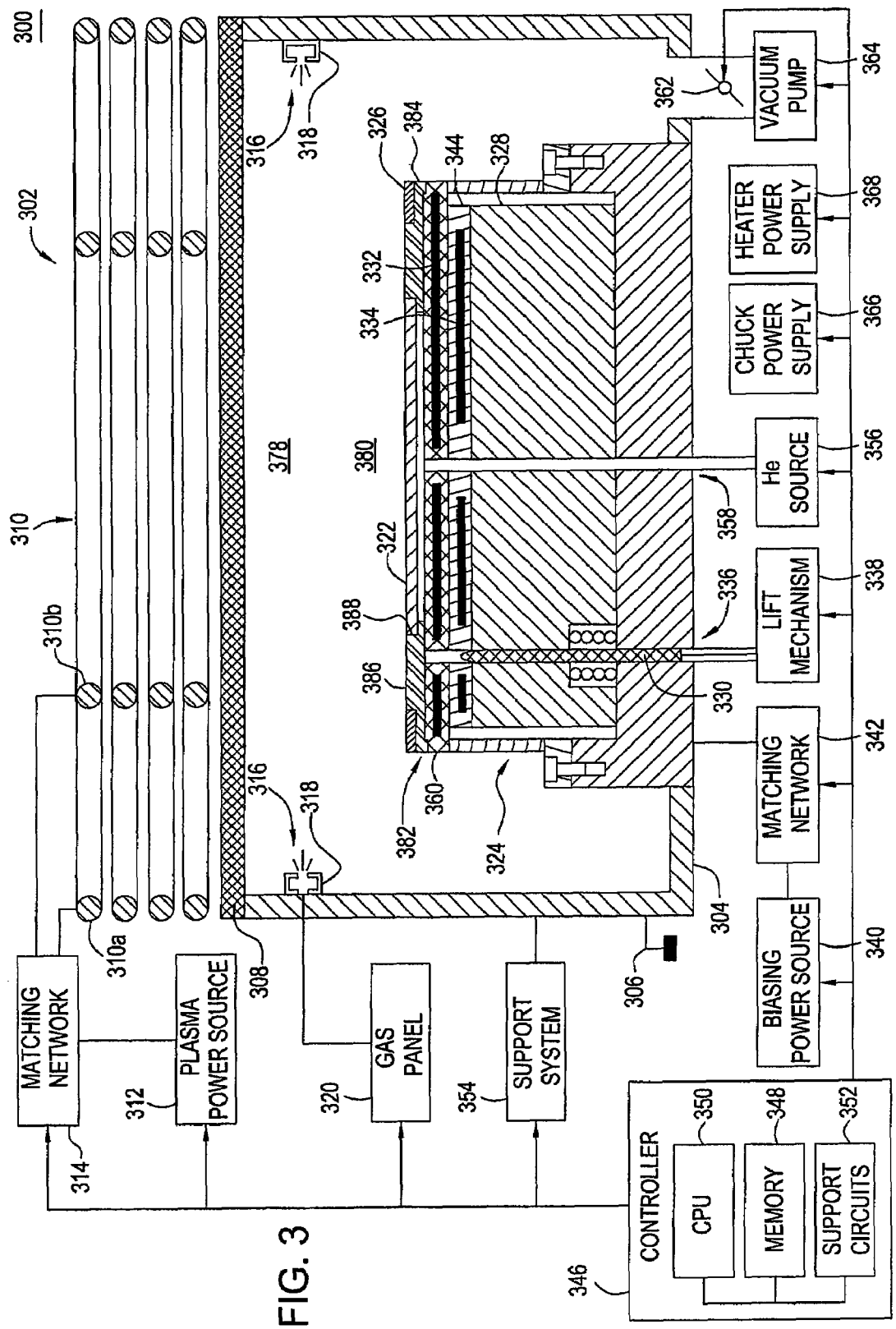
FIG. 3 is a high-level, schematic diagram of an exemplary processing reactor suitable for performing portions of the method of FIG. 1.

FIG. 3 is a high-level, schematic diagram of an exemplary processing reactor suitable for performing etch processes of the method 100. The particular embodiment of the reactor 300 is provided for illustrative purposes and should not be used to limit the scope of the invention. For example, other types of etch reactors may be adapted to perform the method of the present invention, including those from other manufactures.

The reactor 300 generally includes a process chamber 302 having a substrate pedestal 324 disposed within a conductive body (wall) 304, and a controller 346. The reactor 300 also includes conventional systems for process control, internal diagnostic, end point detection, and the like. Such systems are collectively shown as support systems 354.

In the depicted embodiment, the chamber 302 has a substantially flat dielectric ceiling 308. Other modifications of the chamber 302 may have other types of ceilings, e.g., a dome-shaped ceiling. A plasma-generating antenna 310 is disposed above the ceiling 308. The antenna 310 comprises one or more inductive coil elements that may be selectively controlled (two co-axial elements 310a and 310b are shown). The antenna 310 is coupled through a first matching network 314 to a plasma power source 312. The plasma power source 312 is capable of producing up to about 3000 Watts (W) at a tunable radio frequency (RF) in a range from about 50 kHz to 13.56 MHz or greater.

The substrate pedestal (cathode) 324 is coupled through a second matching network 342 to a biasing power source 340. The biasing power source 340 provides up to 1500 W at a frequency of approximately 13.56 MHz and is capable of producing either continuous or pulsed power. In other embodiments, the source 340 may operate at a different frequency or be a DC or pulsed DC source.

In one embodiment, as the DPS® II reactor, the substrate support pedestal 324 includes an electrostatic chuck 360. The electrostatic chuck 360 comprises at least one clamping electrode 332 and is controlled by a chuck power supply 366. In other embodiments, as the Tetra I or Tetra II Photomask reactor, the substrate pedestal 324 comprises other substrate retention mechanisms, such as a susceptor clamp ring, a mechanical chuck, and the like.

The chamber wall 304 is formed from a metal and is coupled to an electrical ground 306 of the reactor. The temperature of the wall 304 may be controlled using liquid-containing conduits (not shown) disposed in the wall 304.

A gas panel 320 is coupled to the process chamber 302 to provide process and/or other gases to the interior of the process chamber 302. In the depicted embodiment, the gas panel 320 is coupled to one or more inlets 316 formed in a channel 318 in the sidewall 304. Alternatively or additionally, the inlets 316 may also be provided, for example, in the ceiling 308 of the process chamber 302. The gas pressure in the chamber 302 is controlled using a throttle valve 362 and a vacuum pump 364.

A reticle adapter 382 is used to secure a substrate (such as a reticle or other workpiece) 322 on the substrate support pedestal 324. The reticle adapter 382 generally includes a lower portion 384 that covers an upper surface of the pedestal 324, a top portion 386 having an opening 388, and an edge ring 326. The opening 388 is sized and shaped to hold the substrate 322. The adapter 382 is formed from etch and high temperature resistant material, such as polyimide, ceramic, or quartz. One such reticle adapter is disclosed in commonly assigned U.S. Pat. No. 6,251,217, issued on Jun. 26, 2001, and incorporated herein by reference.

In operation, a lift mechanism 338 is used to lower/raise the adapter 382, and hence, the substrate 322, onto/off the substrate support pedestal 324. The lift mechanism 338 comprises a plurality of lift pins (one lift pin 330 is shown) that travel through respective guide holes 336.

Temperature of the substrate 322 may be controlled by stabilizing the temperature of the substrate pedestal 324. In one embodiment, the substrate support pedestal 324 comprises a heater 344 and an optional heat sink 328. In one embodiment, the heater 344 includes at least one heating element 334 regulated by a heater power supply 368. Optionally, a backside gas (e.g., helium (He)) from a gas source 356 is provided via a gas conduit 358 to channels formed near an upper surface of the substrate pedestal 324. The backside gas is used to facilitate heat transfer between the pedestal 324 and the substrate 322. Alternatively, the heater 344 may include one or more fluid conduits configured to flow a heat transfer fluid therethrough.

The controller 346 facilitates control of the components of the reactor 300 and comprises a central processing unit (CPU) 350, a memory 348, and support circuits 352. The controller 346 may be one of any form of general-purpose computer processor used in an industrial setting. The memory 348 is one readily available digital storage devices, local or remote. The support circuits 352 generally include cache, power supplies, clock circuits, input/output circuits, and the like. Typically, etch processes of the inventive method 100 are stored as software routines in the memory 348 or other computer-readable medium accessible by the CPU 350. Alternatively or additionally, at least portions of such software routines may also be stored or executed by a CPU (not shown) that is remotely located from the reactor 300.

Although the invention herein has been described with reference to particular exemplary embodiments, it is to be understood that these embodiments are merely illustrative of the principles and applications of the present invention. Therefore, numerous modifications may be made to these embodiments and other arrangements may be devised without departing from the spirit and scope of the present invention, and the scope thereof is defined by the appended claims.

The invention claimed is:

1. A method for fabricating a phase shifting photomask, comprising:
   providing a quartz substrate substantially transparent to light produced by an illumination source of a lithographic system, the substrate comprising a film stack, the film stack further comprising:
      a sacrificial upper layer;
      a first layer having a pre-determined value of transparency to the light; and
      a second layer substantially transparent to the light;
   forming a patterned etch mask on the sacrificial upper layer;
   etching exposed portions of the sacrificial upper layer;
   etching exposed portions of the second layer;
   etching exposed portions of the first layer using the substrate as an etch stop layer, wherein etching the exposed portions of the first layer comprises providing in a processing chamber chlorine ($Cl_2$) and argon (Ar) at a flow ratio $Cl_2$:Ar in a range from about 1:20 to about 20:1, wherein the Ta etch has a selectivity for Ta over quartz of at least about 10:1;
   removing the patterned etch mask; and
   removing the sacrificial upper layer, wherein the remaining film stack and substrate having characteristics that result in a 180 degrees phase shift of light passing through the film stack relative to light passing through an opening in the film stack; wherein:
   the patterned etch mask comprises photoresist;
   the sacrificial upper layer is formed from chromium (Cr) and has a thickness of about 20 to about 200 nm;
   the first layer is formed from tantalum (Ta) and has a pre-determined thickness in a range from about 5 to about 50 nm; and
   the second layer is formed from silicon dioxide ($SiO_2$) and has a pre-determined thickness in a range from about 50 to about 300 nm.

2. The method of claim 1, wherein etching the exposed portions of the sacrificial upper layer further comprises:
   providing a plasma comprising at least one chlorine-containing gas or at least one fluorine-containing gas.

3. The method of claim 1, wherein etching the exposed portions of the second layer further comprises:
   flowing carbon tetrafluoride ($CF_4$) and trifluoromethane ($CHF_3$) at a flow ratio $CF_4$:$CHF_3$ in a range from about 1:50 to about 10:1;
   applying plasma source power between about 100 and about 1500 W;
   applying bias power between about 10 and about 200 W; and
   maintaining gas pressure in the processing chamber between about 0.5 and about 20 mTorr.

4. The method of claim 1, wherein etching the exposed portions of the first layer further comprises:

applying plasma source power between about 75 and about 1500 W;

applying bias power between about 5 and about 100 W; and maintaining gas pressure in the processing chamber between about 1 and about 20 mTorr.

5. The method of claim 1, further comprising:

removing the patterned etch mask using an ashing process or a wet etch process.

6. The method of claim 1, further comprising:

removing the sacrificial upper layer using at least one perchloric-based solvent or a plasma comprising at least one chlorine-containing gas or at least one fluorine-containing gas.

7. A method for fabricating a phase shifting photomask, comprising:

providing a quartz substrate having a tantalum (Ta) layer, a silicon dioxide ($SiO_2$) layer, a chromium (Cr) containing layer, and a patterned photoresist etch mask on the Cr containing layer;

etching portions of the Cr containing layer exposed through the etch mask;

etching portions of the $SiO_2$ layer exposed through the etched Cr containing layer, wherein etching the exposed portions of the $SiO_2$ layer comprises:

providing in a processing chamber carbon tetrafluoride ($CF_4$) and trifluoromethane ($CHF_3$) at a flow ratio $CF_4$:$CHF_3$ in a range from about 1:50 to about 10:1;

applying plasma source power between about 100 and about 1500 W;

applying bias power between about 10 and about 200 W; and maintaining gas pressure in the processing chamber between about 0.5 and about 20 mTorr;

etching portions of the Ta layer exposed through the etched $SiO_2$ layer using the substrate as an etch stop layer, wherein etching the portions of the Ta layer comprises:

providing in a processing chamber chlorine ($Cl_2$) and argon (Ar) at a flow ratio $Cl_2$:Ar in a range from about 1:20 to about 20:1;

applying plasma source power between about 75 and about 1500 W;

applying bias power between about 5 and about 100 W; and maintaining gas pressure in the processing chamber between about 1 and about 20 mTorr, wherein the Ta etch has a selectivity for Ta over quartz of at least about 10:1 and a selectivity for Ta over photoresist of about 1:1;

removing the patterned etch mask; and removing the Cr containing layer.

8. The method of claim 7, wherein the Cr containing layer has a thickness of about 20 to about 200 nm and the $SiO_2$ layer has a thickness in a range from about 50 to about 300 nm and the Ta layer has a thickness in a range from about 5 to about 50 nm.

9. The method of claim 7, wherein etching the exposed portions of the Cr containing layer further comprises:

providing a plasma comprising at least one chlorine-containing gas or at least one fluorine-containing gas.

10. The method of claim 7, wherein removing the Cr containing layer further comprises at least one of exposing the Cr containing layer to at least one perchloric-based solvent, or a plasma comprising at least one chlorine-containing gas or at least one fluorine-containing gas.

* * * * *